United States Patent [19]
Tabuchi et al.

[11] Patent Number: 5,397,665
[45] Date of Patent: Mar. 14, 1995

[54] PHOTOMASK WITH PELLICLE AND METHOD OF TREATING AND STORING THE SAME

[75] Inventors: Kazuhiro Tabuchi; Hiroyuki Inomata; Takashi Yamauchi, all of Tokyo, Japan

[73] Assignee: Dai Nippon Printing Co., Ltd., Tokyo, Japan

[21] Appl. No.: 147,924

[22] Filed: Nov. 4, 1993

Related U.S. Application Data

[63] Continuation-in-part of Ser. No. 692,006, Apr. 26, 1991, abandoned.

[30] Foreign Application Priority Data

Apr. 27, 1990 [JP] Japan .................. 2-113801

[51] Int. Cl.$^6$ .............................................. G03F 9/00
[52] U.S. Cl. ............................. 430/5; 430/311; 428/421; 428/422; 428/522; 428/524
[58] Field of Search .............. 430/5, 311; 428/421, 428/422, 522, 524

[56] References Cited

U.S. PATENT DOCUMENTS

| | | | |
|---|---|---|---|
| 4,551,416 | 11/1985 | Chandross et al. | 430/311 |
| 5,008,362 | 4/1991 | Wilharm et al. | 430/270 |

FOREIGN PATENT DOCUMENTS

| | | |
|---|---|---|
| 195291 | 9/1986 | European Pat. Off. . |
| 232973 | 8/1987 | European Pat. Off. . |
| 2481473 | 10/1981 | France . |

OTHER PUBLICATIONS

World Patents Index Latest, Week 8934 JA(A) 1-179946 (abstract).
Patent Abstracts of Japan, vol. 9, No. 163 (P-371), Jul. 9, 1985 JP(A) 60-39651 (abstract).
World Patents Index Latest, Week 8648 JP (A) 61-231545 (abstract).
Patent Abstracts of Japan, vol. 13, No. 213 (E-759) May 18, 1989 JP (A) 1-25535 (abstract).

*Primary Examiner*—S. Rosasco
*Attorney, Agent, or Firm*—Dellett and Walters

[57] ABSTRACT

A photomask with pellicle which is treated so that even if the obverse and reverse surfaces of the photomask are stained with a trace amount of contaminative particles during cleaning, water content and a low-volatile component are prevented from adhering to such contaminative particles during storage, thereby preventing the photomask from becoming stained with passage of time. Also disclosed is a method of treating and storing the photomask. The photomask is subjected to a hydrophobic treatment by providing the obverse and reverse surfaces thereof with a trimethylsilyl film formed by a reaction of OH groups in these surfaces with 1,1,1,3,3,3-hexamethyldisilazane. Even if contaminative particles are attached to the obverse and reverse surfaces of the photomask in a trace amount during cleaning, no water content or low-volatile component will adhere to such contaminative particles during storage and/or transport of the photomask with a pellicle attached thereto, so that the photomask is prevented from becoming stained with passage of time. Accordingly, the photomask with pellicle can be stably stored for a long period of time and also stably transported, and it can be used any number of times for a long period of time.

2 Claims, 3 Drawing Sheets

PHOTOMASK WITH PELLICLE AND METHOD OF TREATING AND STORING THE SAME

This is a continuation-in-part of application(s) Ser. No. 07/692,006, filed on Apr. 26, 1991, now abandoned.

BACKGROUND OF THE INVENTION

The present invention, which is a CIP of 07/692,006 filed Apr. 26, 1991, now abandoned, relates to a photomask with pellicle used in a photolithographic process in the manufacture of semiconductor products, precision electronic parts, etc. and also relates to a method of treating and storing the same.

Hitherto, photomasks employed in the manufacture of semiconductor products and the like have been produced by various methods and used for patterning of semiconductor products, precision electronic parts, etc. In many cases, such photomasks are used repeatedly, and it is conventional practice to clean each photomask after production and to use it as it is or with a pellicle attached thereto for protection. To store or transport the photomask, it is put in a casing after being cleaned, and in this state it is stored or transported.

Since a photomask has heretofore been cleaned after production and then stored or transported in a casing as it is or with a pellicle attached thereto, as stated above, it is likely that the water content in the air and a low-volatile component contained in the casing and pellicle materials will adhere to contaminative particles attached to the obverse and reverse surfaces of the photomask in a trace amount during or after the cleaning process and the resulting stain will gradually grow with such particles at their centers, thus making an adverse effect on the pattern printing process. For this reason, it has been difficult to store photomasks for a long period of time. In particular, a photomask used for projection exposure, not for contact exposure, is frequently used with a pellicle attached thereto for protecting the surface of the photomask. Therefore, it is necessary to detach the pellicle in order to remove the stain grown on the obverse surface of the mask within the pellicle and on the reverse surface thereof as described above, which is uneconomical in terms of cost and labor. In addition, the photomask itself is likely to be damaged. Accordingly, it is practically difficult to remove such stain by cleaning process. Thus, it has heretofore been difficult to store such photomasks for a long period of time.

SUMMARY OF THE INVENTION

It is an object of the present invention to provide a photomask with pellicle, which is treated so that even if the obverse and reverse surfaces of the photomask are stained with a trace amount of contaminative particles during cleaning, water content and a low-volatile component are prevented from adhering to such contaminative particles at their centers during the storage and/or transport of the photomask, thereby preventing the photomask from becoming stained with passage of time, and also provide a method of treating and storing the above-described photomask.

Stain grows on the obverse and reverse surfaces of a photomask during storage and/or transport in such a way that the water content in the air and a low-volatile component contained in the casing and pellicle materials adhere to contaminative particles attached to the photomask in a trace amount during cleaning process carried out after production or use, and the resulting stain regions gradually enlarge with the contaminative particles at their centers with passage of time. Accordingly, the growth of stain with passage of time can be effectively prevented by preventing the water content in the air and such a low-volatile component from adhering to the photomask or contaminative particles, which have already been present on the obverse and reverse surfaces thereof, during storage and/or transport.

Accordingly, the present invention provides a photomask having a pellicle attached thereto, which is free from the above-described problems, and a method of treating and storing such a photomask.

First, a photomask with pellicle to which the present invention is particularly directed will be explained below.

FIGS. 1(a)-(b) show a perspective view and a sectional view respectively of a photomask 20 with pellicle. In the figures, reference numeral 7 denotes a pellicle frame made of a metal, e.g., aluminum. A pellicle film 8 is uniformly stretched over the upper side of the pellicle frame 7 and bonded thereto at a bonded portion 10. A photomask substrate 5 has a photomask pattern 11 provided on the surface thereof. The frame 7 is bonded to the surface of the photomask substrate 5 by use of an adhesive 9 so that the pellicle film 8 covers the photomask pattern 11. In the photomask 20 with pellicle having the described arrangement, according to the present invention, the obverse and reverse surfaces of the substrate 5 are provided with a hydrophobic film 12 comprising a trimethylsilyl film formed by a reaction of OH groups in the photomask surface with 1,1,1,3,3,3-hexamethyldisilazane, as described later, so that water content in the air and a low-volatile component generated from the bonded portions 9 and 10 are prevented from adhering to the surface of the photomask pattern 11, and also water content in the air and a low-volatile component generated from the bonded portions 9 and 10 and the casing 21 (see FIG. 2) are prevented from adhering to the reverse surface of the mask 20.

The photomask 20 with pellicle is accommodated, for example, in a casing 21 such as that shown in the sectional view of FIG. 2, and in this state it is stored and/or transported. Referring to FIG. 2, the casing 21 has an upper cover 22 and a lower cover 23. The covers 22 and 23 each have a plurality of supports 24 extending inwardly from the inner surface thereof so that the substrate 5 of the photomask 20 is clamped between the supports 24, thereby enabling the photomask 20 to be stably held to endure storage and transport.

Incidentally, the photomask 20 with pellicle is placed with the pellicle side facing down, for example, as schematically shown in FIG. 3, and irradiated with light from a light source 30 disposed above the photomask 20, thereby allowing the photomask pattern 11 to be projected on a wafer 32 as a reduced image through a lens system 31. Thus, the projected pattern 11 is printed on the wafer 32. Even if contaminative particles, e.g., dust particles, having a size of less than about 20 μm are attached to the pellicle 8 of the photomask 20, no image of such particles is formed on the surface of the wafer 32 because the optical path is formed as shown by the broken line in the figure. Accordingly, the surface of the photomask pattern 11 is not stained during storage and transport, and the photomask 20 can be used any number of times as it is without the need for removing the pellicle 8, provided that a relatively large dust particle, stain or cloud-like stain, which exceeds 20 μm in size, is not attached to the reverse surface of the photomask 20 or the surface of the pellicle 8, which form the optical path of light for projection exposure.

Accordingly, in the present invention, the photomask 20 is subjected to a hydrophobic treatment after it has been formed with the pattern 11 and subjected to cleaning and inspection and before the pellicle 8 is attached thereto. That is, the obverse and reverse surfaces of the working mask 5 are subjected to a hydrophobic treatment by exposing them to a room-temperature gas atmosphere containing 1,1,1,3,3,3-hexamethyldisilazane, or by coating them with a room-temperature treating solution containing 1,1,1,3,3,3-hexamethyldisilazane, thereby providing the obverse and reverse surfaces of the working mask 5 with a hydrophobic film 12, which comprises a trimethylsilyl film formed by a reaction of OH groups in the obverse and reverse surfaces of the working mask 5 with 1,1,1,3,3,3-hexamethyldisilazane. By virtue of the presence of the hydrophobic film 12, even if contaminative particles are attached to the obverse and reverse surfaces of the photomask 20 in a trace amount during cleaning, no water content or low-volatile component will adhere to such contaminative particles during storage and/or transport of the photomask with a pellicle attached thereto, so that the photomask is prevented from becoming stained with passage of time. Accordingly, the photomask 20 can be used any number of times as it is, without the need for removing the pellicle 8, for a long period of time.

It should be noted that the above-described hydrophobic film 12 may be provided not only on the substrate of the photomask 20 with pellicle after the pattern formation process but also on reticles, master masks and working masks used for projection exposure in the process for manufacturing semiconductor products.

According to the treating method of the present invention, a photomask which is to be subjected to a hydrophobic treatment is exposed to a room-temperature gas atmosphere containing 1,1,1,3,3,3-hexamethyldisilazane, or it is coated with a room-temperature treating solution containing 1,1,1,3,3,3-hexamethyldisilazane. Since the treatment can be carried out at room temperature, the process is safe and allows a great deal of time and labor to be saved.

Thus, the present invention provides a method of treating and storing a photomask with pellicle, wherein the obverse and reverse surfaces of the photomask are subjected to a hydrophobic treatment by providing them with a trimethylsilyl film formed by a reaction of OH groups in these surfaces with 1,1,1,3,3,3-hexamethyldisilazane, and then at least a pellicle is attached to the obverse surface of the photomask with a clearance provided therebetween. Thereafter, the photomask is stored in the air. Thus, it is possible to prevent the photomask from becoming stained with passage of time.

In addition, the present invention provides a photomask which is subjected to a hydrophobic treatment by providing the obverse and reverse surfaces thereof with a trimethylsilyl film formed by a reaction of OH groups in these surfaces with 1,1,1,3,3,3-hexamethyldisilazane, and which has at least a pellicle attached to the obverse surface thereof with a clearance provided therebetween.

According to the present invention, since the obverse and reverse surfaces of the photomask are subjected to a hydrophobic treatment by a chemical reaction with OH groups in these surfaces, even if contaminative particles are attached to the obverse and reverse surfaces of the photomask in a trace amount during cleaning, no water content or low-volatile component will adhere to such contaminative particles during storage and/or transport of the photomask with a pellicle attached thereto, so that the photomask is prevented from becoming stained with passage of time. Accordingly, the photomask with pellicle can be stably stored for a long period of time and also stably transported, and it can be used any number of times for a long period of time.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Embodiment 1 (gas diffusion method)

In this type of photomask, a pattern is drawn on a glass substrate with chromium (hereinafter referred to as "blank") coated with a photosensitive resin material (resist) by use, for example, of an EB lithography apparatus. Thereafter, developing, etching and other processes are carried out to make a reticle. Next, a blank is repeatedly exposed by use of a photorepeater and then subjected to necessary processes to make a master mask. Finally, the master mask is duplicated onto a blank by contact exposure with a printer and then subjected to necessary processes to make a working mask. As the photomask, a silver halide emulsion mask was commonly employed, but, with the increase in the integration density of ICs or the like, a chromium mask that is formed by depositing a chromium film on a glass substrate, a metal oxide mask, etc. have been increasingly used.

Figure 1A:
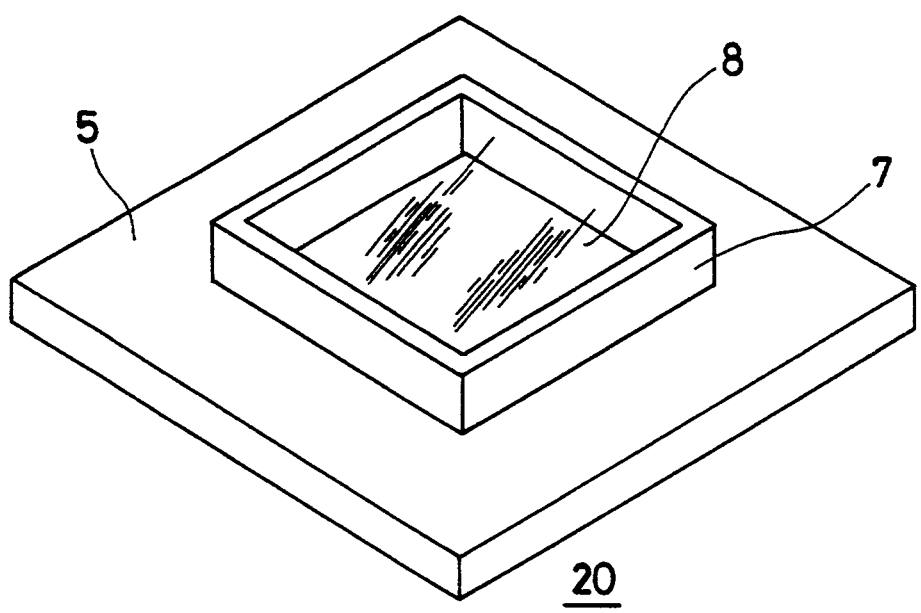
FIG. 1(a) shows a perspective view of a photomask with pellicle according to the present invention.
Figure 1B:
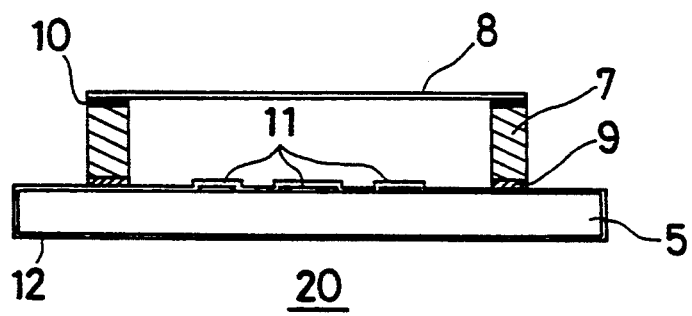
FIG. 1(b) shows a sectional view of a photomask with pellicle according to the present invention.
Figure 2:
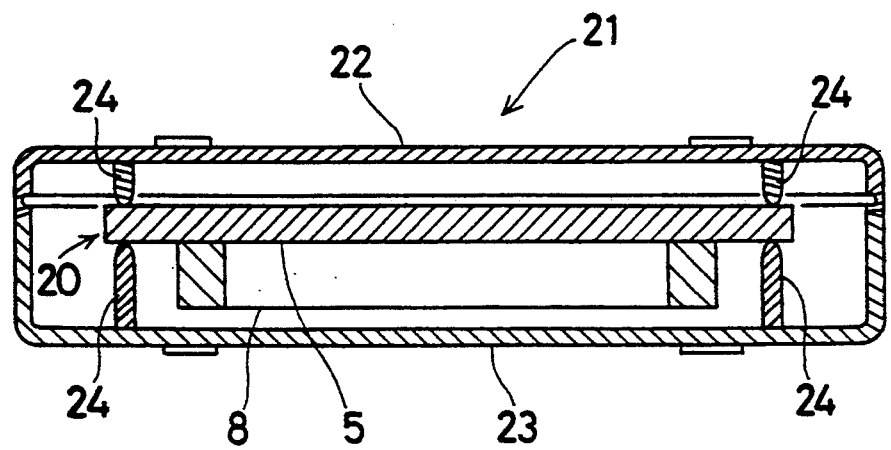
FIG. 2 is a sectional view of the photomask with pellicle accommodated in a casing for storage and transport.
Figure 3:
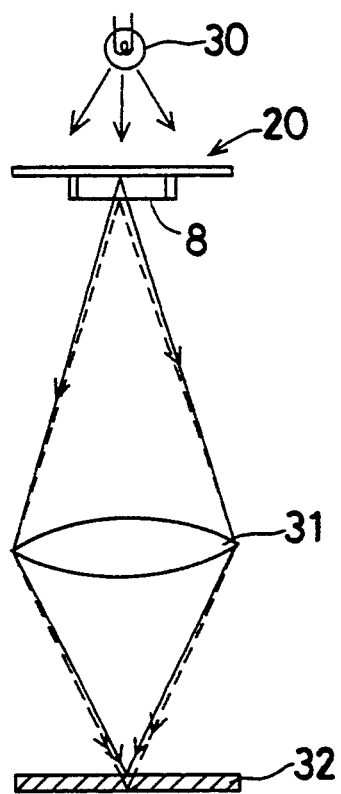
FIG. 3 is a schematic view illustrating projection exposure carried out using the photomask with pellicle.
Figure 4:
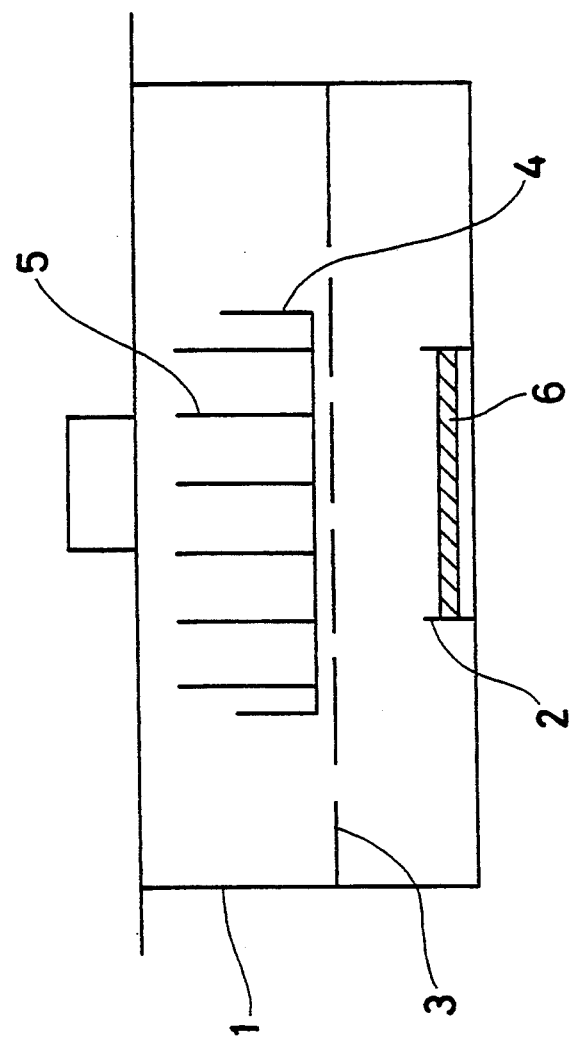
FIG. 4 shows the arrangement of an apparatus for subjecting a photomask to a hydrophobic treatment by a method according to a first embodiment of the present invention.

Such a photomask which is to be stored or transported is cleaned and then dried. Next, the photomask is exposed for a predetermined time to a gas atmosphere, for example, 1,1,1,3,3,3-hexamethyldisilazane (hereinafter referred to as "HMDS"). For this purpose, a lidless container 2, for example, a laboratory dish, filled with HMDS 6 is placed in a hermetically sealed container 1 such as a desiccator, as shown in FIG. 4, and a carrier casing 4 in which reticles, master masks, working masks 5, etc., which are to be treated, are accommodated at spacings is placed in the upper part of the container 1.

The carrier casing 4 accommodating the masks 5 is placed on a grating 3 or the like so that HMDS gas at room temperature will fill the container 1 uniformly.

Hydrophobicity of the obverse and reverse surfaces of the mask is produced by a hydrophobic trimethylsilyl compound that is formed by reaction of HMDS with OH groups in the mask surface. The reaction of HMDS with OH groups takes place as follows:

$$2MOH + (CH_3)_3SiNHSi(CH_3)_3$$

$$\rightarrow 2MOSi(CH_3)_3 + NH_3$$

(wherein M is a metal, compound or the like combined with an OH group)

In the above, hydrophobicity is produced by $2MOSi(CH_3)_3$, which is a trimethylsilyl compound.

The time suitable for the hydrophobic treatment is in the range of from 2 or 3 minutes to several hours, particularly from 4 to 10 minutes.

Specifically, a photomask was exposed for 6 minutes to HMDS vapor at room temperature after it had been cleaned. After a pellicle had been attached to the photomask in an atmosphere of room temperature and about 50% in humidity, the photomask was put in a casing and stored in the same atmosphere. For comparative purposes, a photomask which was not exposed to HMDS vapor after the cleaning process was prepared, and a pellicle of the same type as the above was attached thereto under the same conditions. Then, the photomask was put in a casing and stored in the same atmosphere as the above.

After being stored for 1 year, these two photomasks were inspected with a spot light of 300,000 lx in a darkroom of below 1 1 x. The photomask that had been exposed to HMDS vapor had no stain on the reverse surface of the photomask and on the obverse surface of the photomask, including the pattern portion covered with the pellicle. On the other hand, the photomask that had not been exposed to HMDS vapor had cloud-like stain on the reverse surface of the photomask and on the pattern transmitting portion of the obverse surface of the photomask, which was within the pellicle.

When the cloud-like stain was examined with an optical microscope, it was observed that numerous hemispherical dust particles of about 0.5 μm in size were present on the mask surface.

To test occurrence of stain in a shortened period of storage time, it is possible to employ a method wherein a test sample is placed in a test environment and alternately exposed to a high-temperature and high-humidity atmosphere and a low-temperature and low-humidity atmosphere. For example, two different kinds of photomask with pellicle, that is, a photomask having been subjected to HMDS treatment, and a photomask which had not been subjected to it, were put in respective casings and placed in a test environment where the photomasks were alternately exposed to an atmosphere of 40° C. in temperature and 70% in humidity for 4 hours and an atmosphere of 10° C. and 30% in humidity for 4 hours over a 10 day period. As a result, a significant difference was observed in terms of the occurrence of stain according to whether or not the photomask had been subjected to HMDS treatment. The occurrence and growth of stain was observed independently of the manufacturers of pellicles and the type of pellicle.

The thickness of the reaction film formed by the hydrophobic treatment was several Å to several tens of Å, so that there were no lowering in the transmittance of the transmitting portion of the photomask, no effect on the resolving power and no deterioration of the mask.

Embodiment 2 (coating method)

The same photomask as in the embodiment 1 is coated with HMDS at room temperature. Coating may be carried out by any known method. For example, spray, dip or spin coating methods may be utilized. Excess HMDS can be speedily evaporated in a draft or under reduced pressure.

To the photomask subjected to HMDS treatment, as described above, a pellicle of the same type as in Example 1 was attached under the same conditions as in Example 1. Then, the photomask was put in a casing and stored in the same atmosphere as in Example 1. After being stored for 1 year, the photomask was inspected with a spot light under the same conditions as in Example 1. In this case also, there was no stain on the reverse surface of the photomask and on the obverse surface of the photomask, including the pattern portion covered with the pellicle.

Although in the foregoing embodiments the present invention has been described assuming that photomasks are treated by batch process, a single photomask automatic transfer system may also be applied thereto.

As has been described above, the photomask with pellicle according to the present invention is subjected to a hydrophobic treatment by a chemical reaction with OH groups in the mask surface. Accordingly, even if contaminative particles are attached to the obverse and reverse surfaces of the photomask in a trace amount during cleaning, no water content or low-volatile component will adhere to such contaminative particles during storage and/or transport of the photomask with a pellicle attached thereto, so that the photomask is prevented from becoming stained with passage of time. Accordingly, the photomask with pellicle can be stably stored for a long period of time and also stably transported, and it can be used any number of times as it is for a long period of time.

In the present invention, it is particularly preferable to carry out the hydrophobic treatment with 1,1,1,3,3,3-hexamethyldisilazane.

What we claim is:

1. A method of processing a photomask for projection photolithography comprising:

subjecting obverse and reverse surfaces of a photomask to hydrophobic treatment by reacting OH groups of the surfaces with 1,1,1,3,3,3-hexamethyldisilazane for providing said photomask a trimethylsilyl film so as to preserve said photomask's optical qualities, preventing staining thereof, with passage of time;

attaching a pellicle to at least the obverse surface of the treated photomask with clearance provided therebetween; and employing the treated photomask with pellicle within a projection photolithographic process.

2. A projection photomask manufacture for employment within projection photolithography comprising:

a photomask having a hydrophobic film, as provided by treating the obverse and reverse surfaces of the photomask with 1,1,1,3,3,3-hexamethyldisilazane, wherein 1,1,1,3,3,3-hexamethyldisilazane reacts with OH groups of the surfaces leaving a trimethylsilyl film; and a pellicle attached to at least the obverse surface of the treated photomask with a clearance provided therebetween;

said hydrophobic film and pellicle preserving optical qualities of the resulting projection photomask manufacture with respect to time and having substantially no impact on projection of an image from said photomask when employed therewith during projection photolithography.

* * * * *